(12) United States Patent
Vaillant

(10) Patent No.: US 7,705,905 B2
(45) Date of Patent: Apr. 27, 2010

(54) IMAGE SENSOR

(75) Inventor: Jérôme Vaillant, Chambery (FR)

(73) Assignee: STMicroelectronics S.A., Montrouge (FR)

( * ) Notice: Subject to any disclaimer, the term of this patent is extended or adjusted under 35 U.S.C. 154(b) by 1084 days.

(21) Appl. No.: 11/331,597

(22) Filed: Jan. 13, 2006

(65) Prior Publication Data

US 2006/0152616 A1 Jul. 13, 2006

(30) Foreign Application Priority Data

Jan. 13, 2005 (FR) .................................. 05 50112

(51) Int. Cl.
*H04N 5/225* (2006.01)
(52) U.S. Cl. ...................... 348/340; 348/272
(58) Field of Classification Search ................ 348/340, 348/272; 250/214.1, 208.1; 359/619
See application file for complete search history.

(56) References Cited

U.S. PATENT DOCUMENTS 6,472,653 B1 * 10/2002 Levine et al. ............ 250/208.1

| | | | |
|---|---|---|---|
| 2003/0063204 A1 * | 4/2003 | Suda | 348/272 |
| 2004/0004668 A1 | 1/2004 | Namazue et al. | |
| 2004/0026695 A1 * | 2/2004 | Francois | 257/53 |
| 2004/0223071 A1 * | 11/2004 | Wells et al. | 348/340 |
| 2005/0001146 A1 * | 1/2005 | Quinlan | 250/214.1 |
| 2005/0041296 A1 * | 2/2005 | Hsiao et al. | 359/619 |
| 2005/0270653 A1 * | 12/2005 | Boettiger et al. | 359/626 |

OTHER PUBLICATIONS

French Search Report from French Patent Application 05/50112, filed Jan. 13, 2005.
Patent Abstracts of Japan, vol. 2000, No. 26, Jul. 1, 2002 & JP 2001 267544 A (Sharp Corp), Sep. 28, 2001.
Patent Abstracts of Japan, vol. 2000, No. 07, Sep. 29, 2000 & JP 2000 124438 A (Toshiba Corp.), Apr. 28, 2000.

* cited by examiner

*Primary Examiner*—Tuan Ho
(74) *Attorney, Agent, or Firm*—Lisa K. Jorgenson; James H. Morris; Wolf, Greenfield & Sacks, P.C.

(57) ABSTRACT

An image sensor pixel structure including: a photosensitive area surrounded with a peripheral area placed at the surface of a semiconductor substrate, a stack of several insulating layers alternately exhibiting different refraction coefficients and placed above the peripheral area, a microlens placed at the top of the pixel to have the pixel light converge towards the photosensitive area, and a transparent block placed substantially above the photosensitive area.

16 Claims, 4 Drawing Sheets

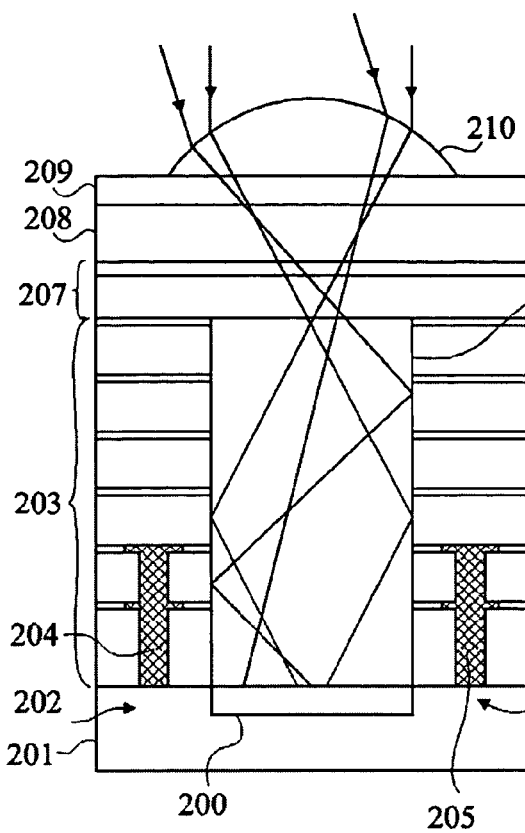 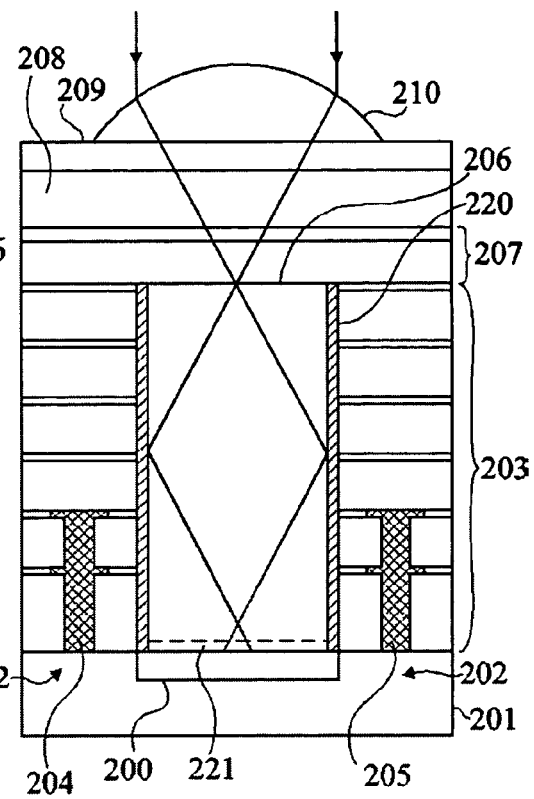
Fig 7    Fig 8
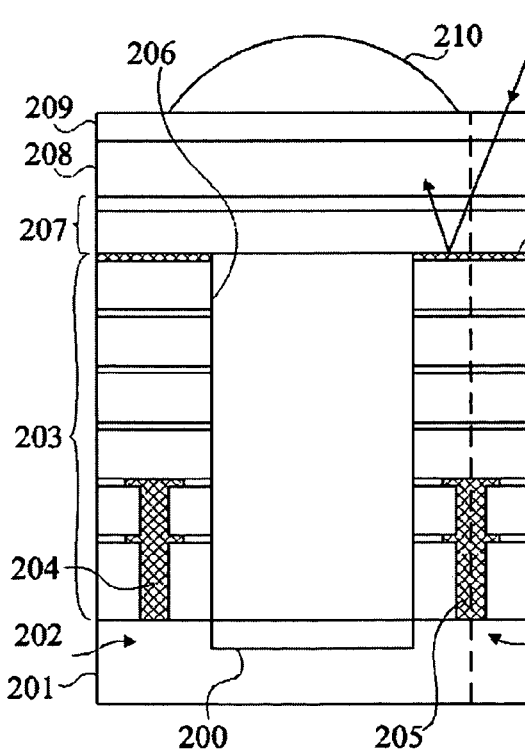 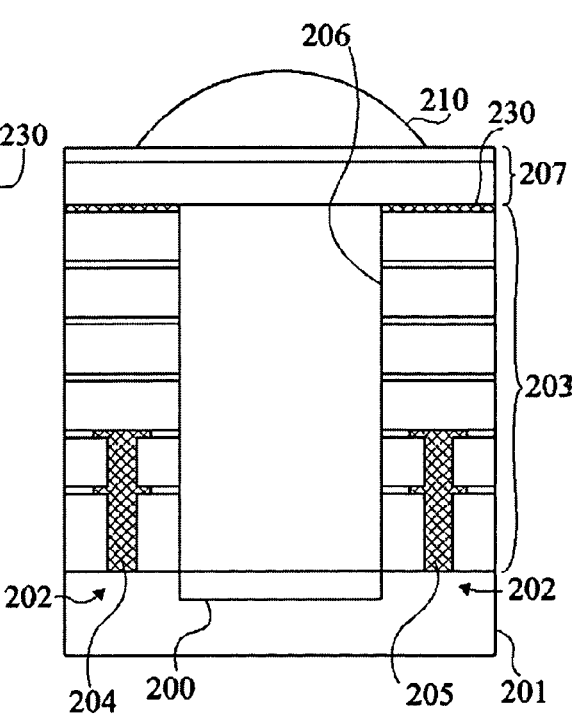
Fig 9    Fig 10

IMAGE SENSOR

BACKGROUND OF THE INVENTION

1. Field of the Invention

The present invention relates to an image sensor and more specifically to the pixel structure of such a sensor.

2. Discussion of the Related Art

FIGS. 1A and 1B are cross-section views of pixels of image sensors placed in integrated circuits comprising an interconnect network made of metal tracks and vias respectively made of aluminum and copper. The methods for manufacturing aluminum or copper interconnects are different. In the case of the pixel of FIG. 1A, corresponding to an "aluminum" technology, the tracks and the vias are separated from one another by the same insulating material, conventionally silicon oxide. In the case of the pixel of FIG. 1B, corresponding to a "copper" technology, an alternation of two types of insulating layers, conventionally silicon oxide and nitride layers, can be observed, the vias crossing oxide layers and the tracks being placed in openings of the nitride layers.

Each pixel is formed above a semiconductor substrate 1. A photosensitive area 2 is formed at the surface of substrate 1. The area of substrate 1 surrounding photosensitive area 2 is called peripheral area 3. Metal connections 4 are placed above peripheral area 3. Metal connections 4 are for example bit or row lines. In this example, the image sensors belong to an integrated circuit comprising six interconnect levels. Metal connections 4 are formed on the first two interconnect levels. The pixel shown in FIG. 1B, corresponding to a "copper" technology, comprises a stack Cb of insulating layers alternately formed of silicon oxide layers and of silicon nitride layers. The pixel shown in FIG. 1A, corresponding to an "aluminum" technology, comprises a stack Ca of six silicon oxide layers substantially forming in the end a single silicon oxide layer. For each pixel, a passivation layer 10 conventionally formed of a silicon oxide layer and of a silicon nitride layer covers stack Ca or Cb. Then, a filtering portion 11 covered with a planarizing layer 12 and with a lens 13 is placed above passivation layer 10.

An incident light beam on lens 13 converges towards photosensitive area 2 where it is "collected". However, at each encountered surface of separation, part of the light beam is reflected and this, all the more as the refraction coefficients of the two materials in contact are remote.

In the case of the pixel shown in FIG. 1A, reflections can be observed at the surface of lens 13, at the contact surface between filtering portion 11 and passivation layer 10, at the intermediary surface between the oxide and nitride layers of passivation layer 10, and at the contact surface between stack Ca and photosensitive area 2.

In the case of the pixel shown in FIG. 1B, the same reflections as those previously described can be observed, as well as parasitic reflections at each of the interfaces between a silicon oxide layer and a silicon nitride layer of stack Cb.

Since the number of interconnect levels of an integrated circuit may be high, and tends to increase, the part of the observed parasitic reflections in the different interconnect levels of a pixel manufactured according to a "copper" technology becomes non-negligible. Further, due to the fact that the nitride layers of these interconnect levels are relatively thin, interference phenomena can be observed. The insulating layers of the different interconnect levels form an interference filter.

FIG. 2 is a diagram illustrating the light intensity received by photosensitive area 2 according to the wavelength of the incident light beams. In the case of a pixel in aluminum technology, the light intensity received by photosensitive area 2 very slightly varies, it is maximum for wavelengths located in the green field and slightly decreases towards red or blue. The maximum received intensity substantially corresponds to 80/90% of the intensity of all the incident light beams. In the case of a pixel in copper technology, significant variations in the intensity received by photosensitive area 2 can be observed according to the wavelength of the incident beams. In the visible field, an alternation of minimum intensities and of maximum intensities can be observed from blue to red. The maximum intensity values are slightly smaller than those sampled for a pixel in aluminum technology. The minimum intensity values are, as for them, very low and may reach a value substantially equal to ⅕ of the intensity of the incident light beams.

The development of integrated circuit manufacturing methods results not only in the above-mentioned problem, but also in the following problem. The increase in the number of functionalities on the same integrated circuit surface generally causes an increase in the number of interconnect levels placed above the semiconductor substrate. This results in an increase in the thickness of the assembly of layers placed between the photosensitive area and the converging lens placed at the top of the pixel. This causes problems of convergence of the received incident light beams.

FIGS. 3A and 3B are simplified cross-section views of two pixels belonging to integrated circuits exhibiting a different number of interconnect levels. Each pixel comprises a photosensitive area 30 formed at the surface of a semiconductor substrate 31. Substrate 31 is covered with an assembly of insulating layers 32, corresponding to the interconnect levels, and with a lens 33.

The convergence of lens 33 of a pixel is selected so that, for each pixel, incident light beams hitting lens 33 converge at the level of photosensitive area 30. The thickness of the assembly of layers 32 of the pixel shown in FIG. 3A being smaller than that of the pixel shown in FIG. 3B, the lens of FIG. 3B should be less converging that that of FIG. 3A.

Further, the incident light beams hitting a pixel may exhibit different inclinations with respect to the normal to the surface of substrate 31. The range of possible inclinations of the incident beams on a pixel depends on the objective placed above the image sensor and on the position of this pixel. The closer the pixel is located to the periphery of the pixel matrix, the more the average inclination of the light beams received by the pixel is significant.

In the case of FIG. 3A, inclined light beams, forming, for example, an angle from 20 to 30 with respect to the normal to the surface of substrate 31, converge at a point of the photosensitive area located substantially at the periphery thereof.

In the case of FIG. 3B, light beams having the same inclination converge towards a point of substrate 31 located outside of photosensitive area 30. Accordingly, the increase in the thickness of the assembly of layers 32 generates a loss of reception of inclined light beams, which decreases the pixel sensitivity. The sensitivity of a pixel even further decreases when, to integrate an ever-increasing number of pixels on the same surface, the surface of the photosensitive area of each pixel is decreased, as shown in dotted lines in FIG. 3B.

Another known problem of image sensors is the inter-pixel interference.

FIG. 4 is a simplified cross-section view of two adjacent pixels of an image sensor. As previously, each pixel comprises a photosensitive area 40, 41 formed at the surface of a substrate 42 above which is placed a stack of layers 43 corresponding to the various interconnect levels of the integrated circuit in which the image sensor is placed. Each pixel further comprises a filtering portion 44, 45 placed above stack 43. Filtering portions 44 and 45 transmit light beams having wavelengths in different ranges, such as green and red. Filtering portions 44 and 45 are conventionally covered with a planarizing layer 46 on which are placed lenses 47 and 48 at the top of each pixel.

In practice, the lenses of each pixel are not contiguous so that a portion of the surface of planarizing layer 46 is not covered. Since two adjacent pixels are not strictly delimited, incident inclined light beams may hit the surface of a pixel on an exposed area of planarizing layer 46 located close to the pixel lens, then cross the virtual border between the two pixels to reach the photosensitive area of the other pixel. Such light beams are in fact not "brought to account" by the right photosensitive area. Such accounting errors result in decreasing the image quality.

SUMMARY OF THE INVENTION

An object of the present invention is to provide a structure of a pixel of good sensitivity of an image sensor placed in an integrated circuit comprising interconnect levels each formed of several insulating layers having different refraction coefficients.

Another object of the present invention is to provide the structure of a pixel having a good sensitivity whatever the thickness of the assembly of insulating layers placed between the photosensitive area and the lens of this pixel.

Another object of the present invention is to provide a pixel structure enabling eliminating inter-pixel interference problems.

To achieve these and other objects, the present invention provides an image sensor pixel structure comprising: a photosensitive area surrounded with a peripheral area placed at the surface of a semiconductor substrate, a stack of several insulating layers alternately exhibiting different refraction coefficients and placed above said peripheral area, a microlens placed at the top of the pixel to have the pixel light converge towards the photosensitive area, and a transparent block placed substantially above the photosensitive area.

In an embodiment of the previously-described pixel structure, the lens focuses the light on a plane close to the upper surface of the photosensitive area.

In an embodiment of the previously-described pixel structure, the refraction coefficient of said transparent block is greater than that of the insulating layers of said stack.

In an embodiment of the previously-described pixel structure, a thin layer of a material exhibiting a refraction coefficient smaller than that of said transparent block is placed between the transparent block and said stack.

In an embodiment of the previously-described pixel structure, a ring-shaped reflective portion is placed above said stack, the reflective portion surrounding the upper portion of said transparent block.

In an embodiment of the previously-described pixel structure, the transparent block is formed of a filtering material only letting through light beams exhibiting wavelengths belonging to a given range of values.

In an embodiment of the previously-described pixel structure, the lens focuses the light on a plane close to the upper surface of the transparent block.

The present invention further provides an integrated circuit comprising an image sensor formed of an assembly of pixels having a structure such as described hereabove, and an interconnect network formed of one or several interconnect levels each comprising first and second insulating layers, said stack of each pixel being formed of at least one pair of insulating layers, each pair of layers being of same thicknesses and of same natures as the first and second insulating layers of an interconnect level.

In an embodiment of the previously-described circuit, the thickness of said stack of each pixel is smaller than the thickness of the assembly of interconnect levels, and an upper transparent block is placed above the pixel assembly, on the transparent blocks and the stacks of these pixels, the thickness of the upper transparent block being such that the cumulated thickness of the upper transparent block and of the transparent block of a pixel is substantially equal to the thickness of the interconnect level assembly.

In an embodiment of the previously-described circuit, the lenses of the pixels of the image sensor are shifted from the center to the periphery of the sensor.

The foregoing objects, features, and advantages of the present invention will be discussed in detail in the following non-limiting description of specific embodiments in connection with the accompanying drawings.

BRIEF DESCRIPTION OF THE DRAWINGS

FIG. 7 is another cross-section view of the structure of a pixel according to another embodiment of the present invention;

FIG. 8 is a cross-section view of the structure of a pixel according to an alternative embodiment of the pixel shown in FIG. 7;

FIG. 9 is a cross-section view of a pixel according to another alternative embodiment of the pixel shown in FIG. 7; and FIG. 10 is a cross-section view of a pixel according to an alternative embodiment of the pixel shown in FIG. 9.

DETAILED DESCRIPTION

Figure 1A:
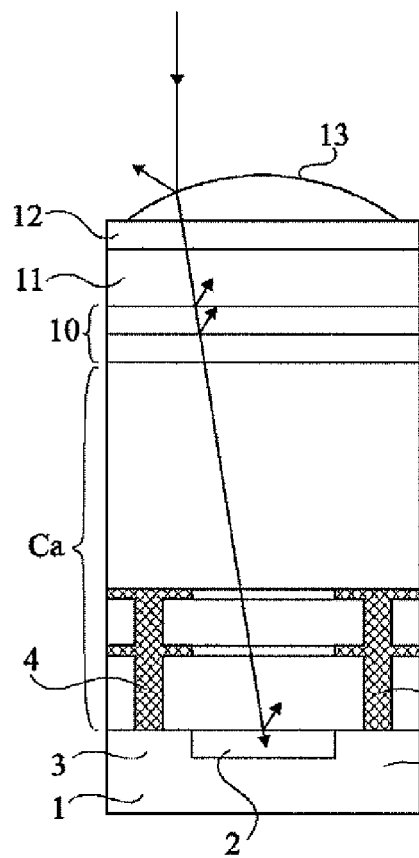
FIGS. 1A and 1B are cross-section views, previously described, of the pixels obtained according to different methods.
Figure 1B:
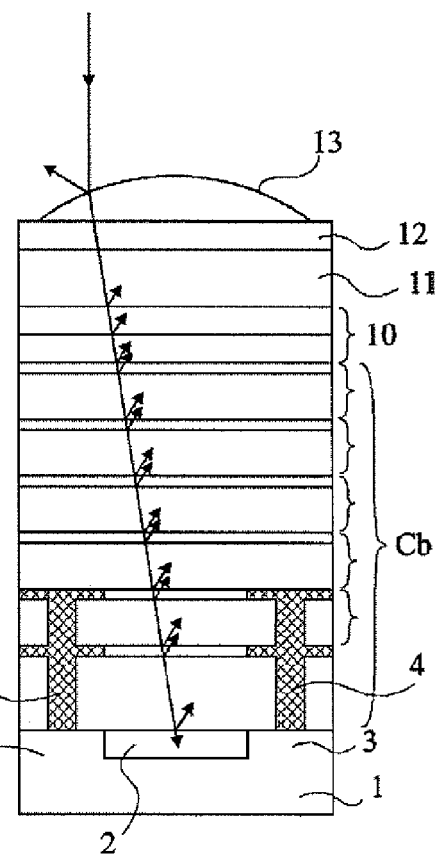
Figure 2:
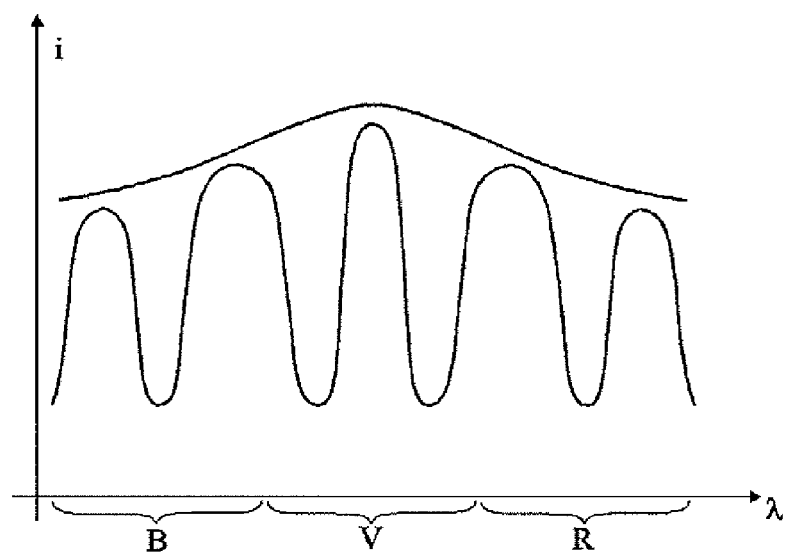
FIG. 2 is a diagram, previously described, illustrating the value of the light intensity received by a pixel according to the wavelength of the incident light beams.
Figure 3A:
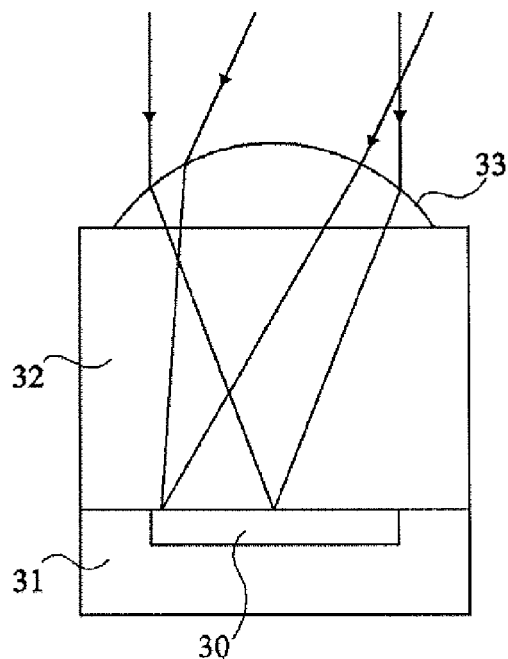
FIGS. 3A and 3B are simplified cross-section views, previously described, of two pixels of different thicknesses.
Figure 3B:
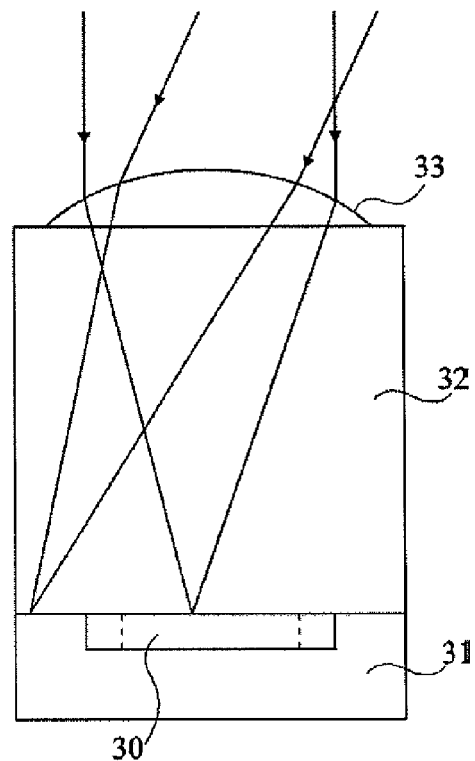
Figure 4:
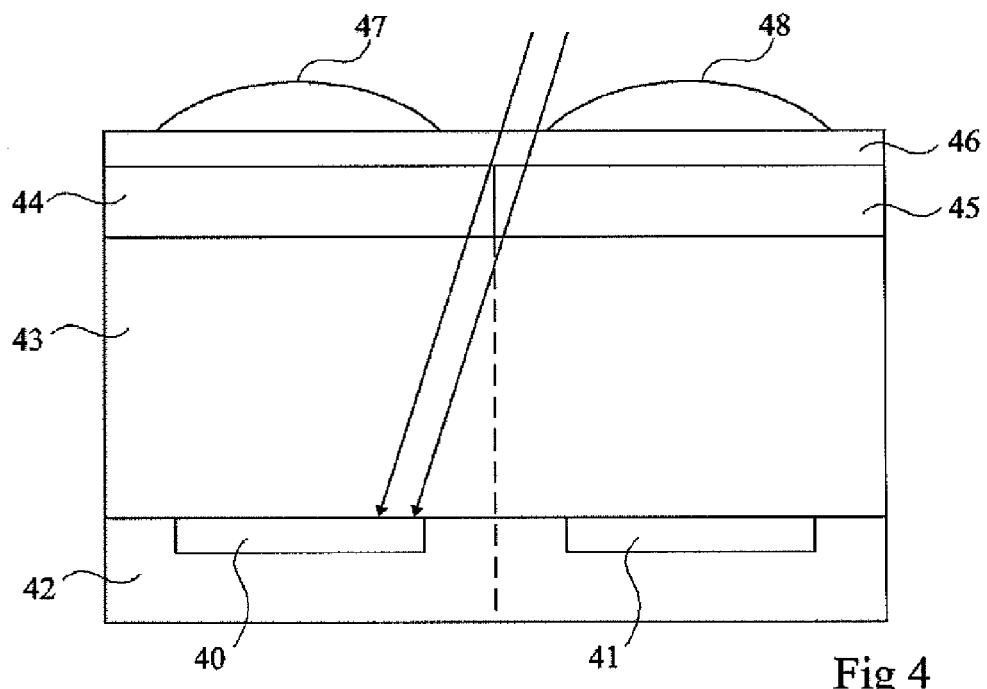
FIG. 4 is a cross-section view, previously described, of two adjacent pixels.

For clarity, the same elements have been designated with the same reference numerals in the different drawings and, further, as usual in the representation of integrated circuits, the various cross-section views are not drawn to scale.

Figure 5:
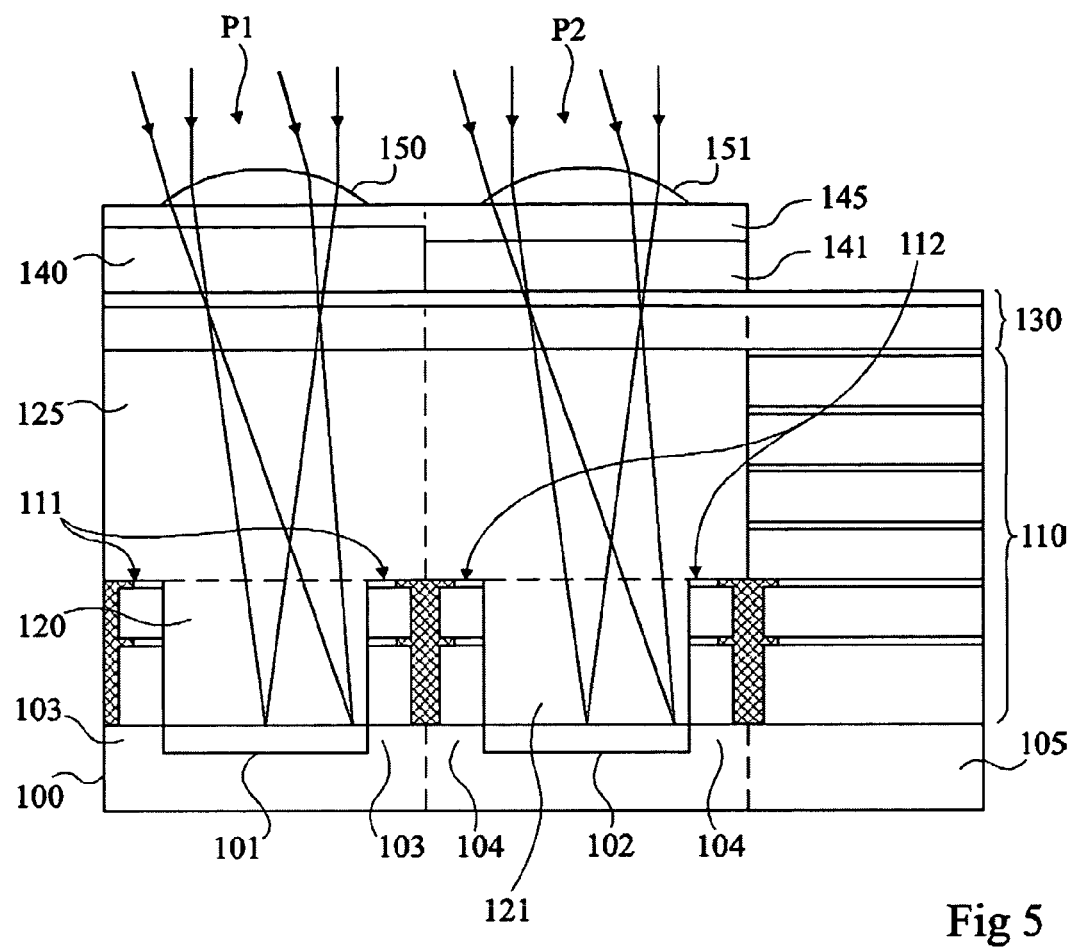
FIG. 5 is a cross-section view of the periphery of an image sensor comprising pixels according to the present invention.

FIG. 5 is a cross-section view of an integrated circuit comprising an image sensor. In this drawing, two peripheral pixels P1, P2 of the image sensor, as well as a portion of the integrated circuit placed against the sensor, can be seen. The integrated circuit is formed in a substrate 100. Each pixel comprises a photosensitive area 101, 102, formed at the surface of substrate 100. Although each pixel is not strictly delimited, it is considered that a pixel comprises a photosensitive area 101, 102, surrounded with a ring-shaped peripheral area 103, 104, both placed at the surface of semiconductor substrate 100, as well as all the elements placed above these two areas. The portion of substrate 100 located outside of the image sensor is called external semiconductor area 105 hereafter. External area 105 is covered with a stack 110 of insulating layers such that two successive layers exhibit different refraction coefficients. Stack 110 corresponds to the insulating layers in which the conductive tracks and vias of the integrated circuit interconnect network are placed. In this example, six interconnect levels are shown. Each interconnect level comprises two insulating layers, a lower layer for example formed of silicon oxide in which are placed conductive vias and an upper layer for example formed of silicon nitride in which are placed conductive tracks.

Each of peripheral areas 103 and 104 of the pixels is covered with a stack of insulating portions 111, 112 having a ring shape similar to that of peripheral areas 103 and 104. The thickness and the composition of the insulating portions of stacks 111 and 112 are the same as those of the insulating layers of stack 110. In this example, stacks 111 and 112 are formed of four insulating portions corresponding to the first two interconnect levels of stack 110. Sets of conductive tracks and vias are placed in openings of layers of each of stacks 111 and 112 covering peripheral areas 103 and 104 of each of the pixels. In this example, several stacks, each formed of two vias and of two tracks, are respectively placed above each virtual border separating two peripheral areas of two pixels or above the virtual limit separating external semiconductor area 105 and peripheral area 104 of the peripheral pixel of the image sensor.

According to an aspect of the present invention, each pixel comprises a block 120 or 121 of a transparent material substantially placed above its photosensitive area 101 or 102 inside of ring-shaped stack 111 or 112 covering peripheral area 103 or 104 of this pixel. Blocks 120 and 121 are, for example, formed of a transparent insulating material such as silicon oxide or silicon nitride. The block structure is as homogenous as possible across its entire thickness to ensure a good transmission of the incident light beam through this block.

In this example of embodiment of the present invention, transparent blocks 120, 121 and the stacks of insulating layers 111, 112 respectively placed above photosensitive areas 101, 102 and peripheral areas 103, 104 of each of pixels P1, P2 of the image sensor are covered with an upper transparent block 125. The thickness of upper block 125 substantially corresponds to the thickness of the four upper interconnect levels of stack 110.

Upper transparent block 125 and stack 110 are covered with a passivation layer 130 formed in this example of a silicon oxide layer covered with a silicon nitride layer.

Each pixel P1, P2 of the image sensor comprises a filtering portion 140, 141 placed above passivation layer 130 substantially above its photosensitive areas 101, 102 and peripheral areas 103, 104. In this example, the two filtering portions 140 and 141 of the two shown pixels P1 and P2 let transmit beams having wavelengths respectively in the green and in the red range. It should be noted that the thicknesses of the two filtering portions 140 and 141 are not identical in this example. However, the filtering portions of each of the pixels are covered with a planarizing layer 145 exhibiting a planar upper surface. A lens 150, 151 is placed at the top of each pixel P1, P2 on planarizing layer 145.

An advantage of the described pixel structure is that the photosensitive area of each pixel is covered with a limited number of surfaces of separation likely to reflect part of the incident light beams of each pixel. Accordingly, a large proportion of the light intensity reaching the top of each pixel is detected at the level of its photosensitive area.

The image sensor may be obtained according to various manufacturing methods. An example of an integrated circuit manufacturing method comprising such an image sensor is the following. All the photosensitive areas of the image sensor as well as all the semiconductor components of the integrated circuit are formed in the semiconductor substrate. The first two interconnect levels of the integrated circuit are then formed. The first two interconnect levels are then etched to form openings above each of the photosensitive areas of the pixels of the image sensor. Then, these openings are filled with a transparent material to form what is here called a "transparent block". The other interconnect levels of the integrated circuit are then formed. These last interconnect levels are then etched to form a large opening above the entire pixel matrix, which is then filled with a transparent material. A passivation layer, filtering portions for each of the pixels, a planarizing layer covering these filtering portions, followed by lenses placed at the top of each of the pixels, are then formed.

Figure 6:
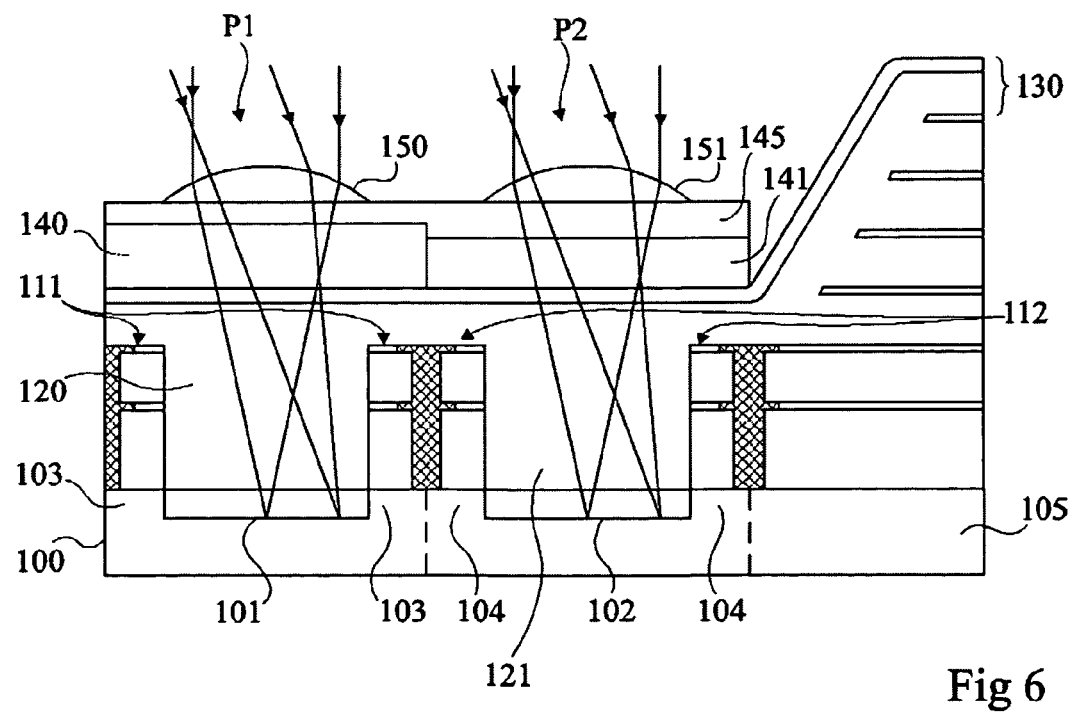
FIG. 6 is a cross-section view of the periphery of an image sensor according to a variation of the sensor shown in FIG. 5.

FIG. 6 is a cross-section view of an integrated circuit comprising an image sensor substantially identical to that shown in FIG. 5, except that it comprises no upper transparent block. The integrated circuit passivation layer directly covers transparent blocks 120, 121, and stacks 111 and 112 of insulating layers of each of the pixels of the image sensor.

Such a structure can be obtained according to the previously-described method, except that the openings formed in the last interconnect levels above the entire pixel matrix are not filled with a transparent material.

FIG. 7 is a cross-section view of the structure of a pixel according to another embodiment of the present invention. The pixel comprises a photosensitive area 200 formed at the surface of a semiconductor substrate 201. The area of substrate 201 surrounding photosensitive area 200 is called peripheral area 202. Peripheral area 202 is covered with a ring-shaped stack of insulating portions 203 such that two successive portions exhibit different refraction coefficients. The number and the nature of the insulating portions of stack 203 are a function of the integrated circuit in which the pixel is placed. An integrated circuit generally comprises several interconnect levels. In the present invention, the case where each interconnect level is formed of two insulators exhibiting different refraction coefficients, as is the case in modern integrated circuits where the tracks and vias of the interconnect network are made of copper and placed in an alternation of silicon oxide and of silicon nitride layers, is more specifically considered.

It should be noted that in integrated circuits where the tracks and vias of the interconnect network are placed in layers of the same material, such as silicon oxide, it is possible for the different layers to exhibit slightly different refraction coefficients, and accordingly for the interfaces between these layers to cause parasitic reflections. It can then be provided to place pixels according to the present invention in such integrated circuits.

Sets of conductive tracks and vias, for example corresponding to bit or row lines, are placed in openings of the four lower insulating portions of stack 203. In this cross-section view, sets of vias and tracks 204 and 205 can be seen on each visible side of ring-shaped stack 203.

According to an aspect of the present invention, a transparent block 206 is placed above photosensitive area 200 inside of ring-shaped stack 203.

Transparent block 206 and stack 203 are covered with a passivation layer 207 formed, for example, of a silicon oxide layer covered with a nitride layer. Passivation layer 207 is covered with a filtering portion 208 itself covered with a planarizing layer 209. A lens 210 is placed at the top of the pixel above planarizing layer 209.

Transparent block 206 is formed of a transparent material exhibiting a refraction coefficient greater than that of the insulating portions of stack 203.

Block 206 thus forms the equivalent of a waveguide. Light beams hitting the pixel surface are directed by lens 210 to the upper surface of transparent block 206 where they enter the waveguide. When these beams reach the level of the interface between transparent block 206 and stack 203, they are reflected in the waveguide and thus descend by successive reflections to reach photosensitive area 200.

The presence of a waveguide above the photosensitive area of a pixel provides a good detection of the incident light beams whatever the thickness of stack 203. This increases the pixel sensitivity.

Further, in this embodiment of the present invention, it is not necessary for the lens to be very slightly bulged to have the incident light beams converge onto photosensitive area 200. Indeed, it is enough for the incident light beams to converge to the upper surface of transparent block 206, the waveguide then being in charge of leading them to photosensitive area 200. Since the forming of a bulged lens is easier, the presence of a waveguide in a pixel enables simplifying the image sensor manufacturing method.

The pixel described in relation with FIG. 7 may be obtained according to various manufacturing methods. An example of a method for manufacturing an integrated circuit comprising an image sensor formed of such a pixel is the following. All the photosensitive areas of the pixels of the images sensors as well as all the semiconductor components of the integrated circuit are formed in a semiconductor substrate. All the integrated circuit interconnect levels are then formed and these interconnect levels are etched to form openings above each of the photosensitive areas of the image sensor pixels. Then, the openings are filled with a transparent material. A passivation layer, a filtering portion for each pixel, a possible planarizing layer, followed by a lens at the top of each pixel, are then formed.

FIG. 8 is a cross-section view of the structure of a pixel according to an alternative embodiment of the previously-described pixel. The structure of this pixel is substantially identical to that of the pixel shown in FIG. 7 except that a thin layer 220 of a material exhibiting a refraction coefficient smaller than that of transparent block 206 is placed between transparent block 206 and the ring-shaped stack of insulating portions 203. This thin layer 220 may be necessary in the case where transparent block 206 is formed of a material exhibiting a refraction coefficient slightly greater, or even smaller, than that of one of the insulating portions of stack 203 to guarantee a good reflectivity whatever the inclination of the light beams entering block 206.

The pixel shown in FIG. 8 can be obtained according to the method previously described for the pixel shown in FIG. 7 by performing, prior to the filling of the openings of a transparent material, a deposition against the opening walls of a thin layer of a material exhibiting a refraction coefficient smaller than that of the transparent filling material. A known way to deposit such a thin layer is to perform a conformal deposition. In this case, a thin layer 221, shown in dotted lines in FIG. 8, also forms at the bottom of the openings. The presence of this thin layer between block 206 and photosensitive area 200 imposes for the deposited material to be transparent so that the light beams reach the photosensitive area. The thin deposited layer is for example formed of a silicon oxide and the transparent block is for example formed of silicon nitride or silicon oxynitride ($Si_xO_yN_z$).

FIG. 9 is a cross-section view of a pixel according to an alternative embodiment of the pixel shown in FIG. 7. The structures are substantially identical except that the last insulating portion of stack 203 is replaced with a reflective portion 230. Thus, reflective portion 230 surrounds the upper portion of transparent block 206. This reflective portion 230 is used to reflect the parasitic light beams normally intended for the pixels placed next to the considered pixel. As shown in FIG. 9, an inclined incident light beam hitting the surface of the neighboring pixel and crossing the virtual border between these two pixels is reflected by reflective portion 230.

Reflective portion 230 may be formed of any reflective material. Portion 230 is for example a metal portion obtained in the forming of the conductive tracks placed on the last interconnect level of the integrated circuit in which the pixel is placed.

An advantage of this pixel structure is that it enables eliminating inter-pixel interference problems.

Such a pixel can be obtained according to the previously-described method for forming the pixel shown in FIG. 7. Reflective portion 230 may advantageously be used as a mask for etching the interconnect levels to form the openings intended to host the transparent blocks placed above photosensitive areas of the pixels of the image sensor.

FIG. 10 is a cross-section view of a pixel according to an alternative embodiment of the above-described pixel. The structure of this pixel is substantially identical to that of the pixel shown in FIG. 9 except that it comprises no filtering portion, and no planarizing layer placed between the passivation layer and the upper lens. Further, a transparent block placed above the photosensitive area is formed of a filtering material. Such a filtering material for example is a colored resin. Thus, only the light beams having wavelengths within a given range, for example, that of green, blue, or red, can reach the photosensitive area of the pixel.

An advantage of this embodiment is that the distance separating the entrance of the waveguide and the upper lens becomes very small, which enables using very strongly bulged lenses, which are easier to form.

Of course, the present invention is likely to have various alterations, modifications, and improvements which will readily occur to those skilled in the art. In particular, the stack of insulating portions placed above the peripheral area surrounding the photosensitive area of a pixel according to the present invention may be formed of insulating materials other than those conventionally used for the manufacturing of the interconnect levels of an integrated circuit comprising copper interconnects, that is, silicon oxide and nitride.

Further, it may be provided to place a pixel comprising a waveguide above its photosensitive area in an integrated circuit having its interconnect levels formed according to an "aluminum"-type technology, the interconnects being placed in an assembly of insulating layers of same natures. The waveguide of such a pixel is then surrounded with a substantially homogenous ring-shaped insulating portion placed above the peripheral area surrounding the photosensitive area of the pixel. A thin layer exhibiting a refraction coefficient smaller than that of the transparent block may be placed between the transparent block and the ring-shaped insulating portion.

Further, whatever the embodiment of a pixel according to the present invention, the transparent block placed above the photosensitive area of this pixel may be formed of a filtering material that transmits only the light beams having their wavelengths within a given range such as that of red, green, or blue.

Further, a shifting of the pixel lenses from the center to the outside of the matrix may be provided to increase the sensitivity of the peripheral pixels.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

what is claimed is:

1. An image sensor pixel structure comprising:
   a photosensitive area surrounded with a peripheral area placed at a surface of a semiconductor substrate,
   a transparent block placed substantially above the photosensitive area, the transparent block being formed of a filtering material that only passes light beams exhibiting wavelengths belonging to a given range of values,
   a stack of several insulating layers alternately exhibiting different refraction coefficients and placed above said peripheral area, and
   a microlens placed above the transparent block and adapted to converge light towards the photosensitive area.

2. The pixel structure of claim 1, wherein a refraction coefficient of said transparent block is greater than a refraction coefficient of the insulating layers of said stack.

3. The pixel structure of claim 1, wherein a thin layer of a material exhibiting a refraction coefficient smaller than a refraction coefficient of said transparent block is placed between the transparent block and said stack.

4. The pixel structure of claim 1, further comprising a ring-shaped reflective portion placed above said stack, the reflective portion surrounding an upper portion of said transparent block.

5. The pixel structure of claim 1, wherein the microlens focuses the light on a plane adjacent to an upper surface of the transparent block.

6. An integrated circuit comprising an image sensor formed of an assembly of image sensor pixel structures according to claim 1, and an interconnect network stack formed of at least one interconnect level, the at least one interconnect level comprising first and second insulating layers, each image sensor pixel structure being formed of at least one pair of insulating layers, each pair of insulating layers having a same thickness as the first and second insulating layers of the at least one interconnect level.

7. The integrated circuit of claim 6, wherein a thickness of the transparent block of each image sensor pixel structure is smaller than a thickness of the interconnect network stack, and wherein an upper transparent block is placed above the assembly of image sensor pixel structures, a thickness of the upper transparent block being such that a cumulative thickness of the upper transparent block and the transparent block of an image sensor pixel structure is substantially equal to the thickness of the interconnect network stack.

8. The integrated circuit of claim 6, wherein a lens of each image sensor pixel structure are shifted from a center to a periphery of the image sensor pixel structure.

9. An image sensor pixel comprising:
   a pixel assembly comprising:
      a semiconductor substrate;
      a photosensitive area disposed on the substrate;
      a transparent block disposed directly above the photosensitive area; and
      at least one insulating layer disposed above the semiconductor substrate wherein the transparent block comprises a filtering material that selectively transmits light having wavelengths within a given range of values.

10. The image sensor pixel of claim 9, wherein a peripheral area surrounds the photosensitive area and wherein the at least one insulating layer is disposed directly above the peripheral area.

11. The image sensor of claim 9, further comprising a layer of material disposed between the transparent block and the at least one insulating layer.

12. The image sensor pixel of claim 9, wherein the at least one insulating layer comprises a stack of several insulating layers alternately exhibiting different refraction coefficients.

13. The image sensor pixel of claim 9, wherein a refraction coefficient of the transparent block is greater than a refraction coefficient of the at least one insulating layer.

14. The image sensor pixel of claim 9, wherein a refraction coefficient of the layer of material is less than a refraction coefficient of the transparent block.

15. The image sensor pixel of claim 9, wherein the pixel assembly further comprises a ring-shaped reflective portion disposed above the at least one insulating layer and surrounding at least a portion of the transparent block.

16. The image sensor pixel of claim 9, further comprising a lens placed atop of the pixel assembly.

* * * * *